(12) United States Patent
Aikawa et al.

(10) Patent No.: US 9,203,015 B2
(45) Date of Patent: Dec. 1, 2015

(54) MAGNETIC STORAGE DEVICE

(71) Applicants: Hisanori Aikawa, Seoul (KR);
Masayoshi Iwayama, Seoul (KR);
Akiyuki Murayama, Seoul (KR);
Sumio Ikegawa, Seoul (KR)

(72) Inventors: Hisanori Aikawa, Seoul (KR);
Masayoshi Iwayama, Seoul (KR);
Akiyuki Murayama, Seoul (KR);
Sumio Ikegawa, Seoul (KR)

(*) Notice: Subject to any disclaimer, the term of this patent is extended or adjusted under 35 U.S.C. 154(b) by 0 days.

(21) Appl. No.: 14/015,966

(22) Filed: Aug. 30, 2013

(65) Prior Publication Data

US 2014/0284743 A1    Sep. 25, 2014

Related U.S. Application Data

(60) Provisional application No. 61/804,441, filed on Mar. 22, 2013.

(51) Int. Cl.
| H01L 21/02 | (2006.01) |
| H01L 43/12 | (2006.01) |
| H01L 43/08 | (2006.01) |

(52) U.S. Cl.
CPC ............. *H01L 43/12* (2013.01); *H01L 43/08* (2013.01)

(58) Field of Classification Search
CPC .... H01L 27/222; H01L 27/226; H01L 27/224
USPC ........................................................ 257/295
See application file for complete search history.

(56) References Cited

U.S. PATENT DOCUMENTS

| 6,462,395 | B1 | 10/2002 | Fukuda et al. |
| 6,809,361 | B2 | 10/2004 | Honlein et al. |
| 6,992,342 | B2 | 1/2006 | Motoyoshi et al. |
| 7,463,509 | B2 | 12/2008 | Kim et al. |
| 8,492,808 | B2 | 7/2013 | Omori et al. |
| 2004/0023496 | A1 | 2/2004 | Jung et al. |
| 2004/0113175 | A1 | 6/2004 | Motoyoshi et al. |
| 2004/0183110 | A1 | 9/2004 | Honlein et al. |
| 2004/0188730 | A1* | 9/2004 | Lin et al. ................. 257/295 |
| 2005/0140016 | A1 | 6/2005 | Shim et al. |
| 2008/0135958 | A1 | 6/2008 | Kajiyama et al. |
| 2008/0268640 | A1 | 10/2008 | Fang et al. |
| 2011/0254112 | A1 | 10/2011 | Yamanaka et al. |

(Continued)

FOREIGN PATENT DOCUMENTS

| JP | 2001127151 A | 5/2001 |
| JP | 2008130807 A | 6/2008 |

(Continued)

OTHER PUBLICATIONS

U.S. Appl. No. 14/018,215; Inventor: Yoshinori Kumura; Title: "Magnetic Memory and Manufacturing Method Thereof"; filed Sep. 4, 2013.

(Continued)

*Primary Examiner* — Elias M Ullah
(74) *Attorney, Agent, or Firm* — Holtz, Holtz, Goodman & Chick PC

(57) ABSTRACT

According to one embodiment, a magnetic storage device includes an insulating region, a lower electrode including a first portion formed in a hole provided in the insulating region and a second portion protruded from the insulating region, a spacer insulating film formed on a side surface of at least the second portion of the lower electrode, a magnetic tunneling junction portion formed on a top surface of the lower electrode, and an upper electrode formed on the magnetic tunneling junction portion.

8 Claims, 4 Drawing Sheets

(56) References Cited

U.S. PATENT DOCUMENTS

| | | |
|---|---|---|
| 2011/0266600 A1 | 11/2011 | Kanaya |
| 2012/0043630 A1 | 2/2012 | Omori et al. |
| 2012/0135543 A1 | 5/2012 | Shin et al. |
| 2012/0156844 A1* | 6/2012 | Kim et al. .................... 438/270 |
| 2012/0193693 A1 | 8/2012 | Kanaya |
| 2012/0326250 A1* | 12/2012 | Gaidis et al. ................. 257/421 |
| 2013/0015541 A1 | 1/2013 | Kanaya |

FOREIGN PATENT DOCUMENTS

| | | |
|---|---|---|
| JP | 2011-228443 A | 11/2011 |
| JP | 2011-233835 A | 11/2011 |
| JP | 2012119684 A | 6/2012 |
| JP | 2012-160671 A | 8/2012 |
| JP | 2013-021108 A | 1/2013 |
| TW | 251294 B | 7/1995 |
| TW | 355042 B | 3/1999 |
| TW | 242041 | 10/2005 |
| TW | 201230142 A | 7/2012 |
| WO | WO 2008/108109 A1 | 9/2008 |

OTHER PUBLICATIONS

Bandaru, "Electrical Properties and Applications of Carbon Nanotube Structures", Journal of Nanoscience and Nanotechnology, vol. 7, pp. 1-29, Jan. 2007.

* cited by examiner

MAGNETIC STORAGE DEVICE

CROSS-REFERENCE TO RELATED APPLICATIONS

This application claims the benefit of U.S. Provisional Application No. 61/804,441, filed Mar. 22, 2013, the entire contents of which are incorporated herein by reference.

FIELD

Embodiments described herein relate generally to a magnetic storage device.

BACKGROUND

It is important for magnetic storage devices using a magnetic tunneling junction (magnetoresistance effect element) to control the shape of the magnetic tunneling junction. If etching is performed too excess in patterning a magnetic tunneling junction film, it is likely that a redeposition layer formed on the side surface of a magnetic tunneling junction at the time of the etching will cause a short-circuit between magnetic layers between which a tunnel barrier layer is interposed. If etching is not fully performed to the contrary, there is a possibility that adjacent magnetic tunneling junctions will not completely be separated from each other.

It is thus desirable that a magnetic storage device using a magnetic tunneling junction should be configured by a method to allow the magnetic tunneling junction to function with reliability.

DETAILED DESCRIPTION

In general, according to one embodiment, a magnetic storage device includes: an insulating region; a lower electrode including a first portion formed in a hole provided in the insulating region and a second portion protruded from the insulating region; a spacer insulating film formed on a side surface of at least the second portion of the lower electrode; a magnetic tunneling junction portion formed on a top surface of the lower electrode; and an upper electrode formed on the magnetic tunneling junction portion.

First Embodiment

FIGS. 1-7 are schematic sectional views each partly showing a magnetic storage device manufacturing method according to a first embodiment.

Figure 1:
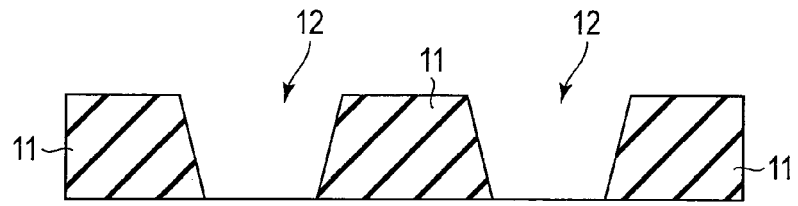
FIG. 1 is a schematic sectional view partly showing a magnetic storage device manufacturing method according to a first embodiment.

Referring first to FIG. 1, a tapered hole 12 is formed in an insulating region (e.g., an interlayer insulating film) 11 by reactive ion etching (RIE). The insulating region 11 is formed of a silicon oxide film. Though not shown, for example, a semiconductor substrate and a transistor are provided below the insulating region 11.

Figure 2:
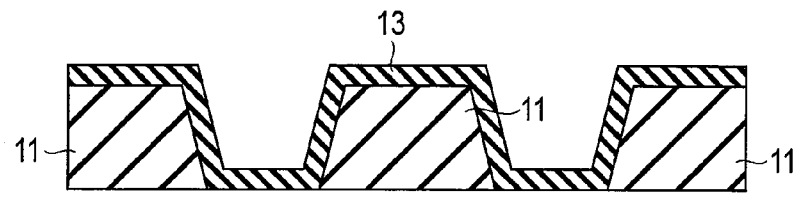
FIG. 2 is a schematic sectional view partly showing the magnetic storage device manufacturing method according to the first embodiment.

Referring then to FIG. 2, a silicon nitride film is formed as a spacer insulating film 13 to have a thickness of about 5 nm on the entire surface of the resultant structure by chemical vapor deposition (CVD). As the spacer insulating film 13, an atomic layer deposition (ALD) alumina (AlOx) film can be used.

Figure 3:
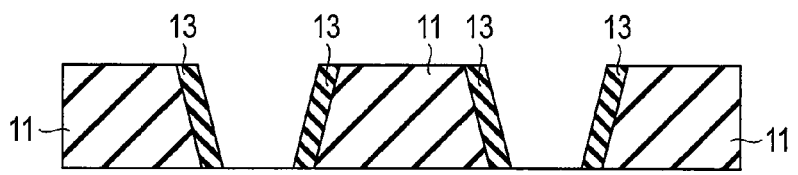
FIG. 3 is a schematic sectional view partly showing the magnetic storage device manufacturing method according to the first embodiment.

Referring then to FIG. 3, the spacer insulating film 13 is etched by RIE. As a result, the spacer insulating film 13 is removed from the top of the insulating region 11 and the bottom of the hole 12 and thus remains on the inner surface of the hole 12.

Figure 4:
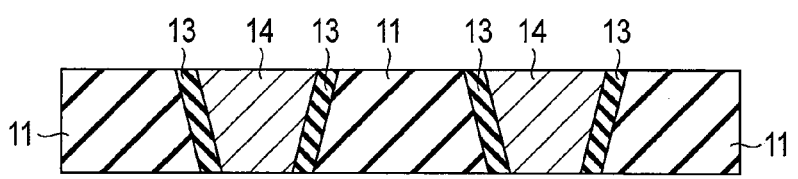
FIG. 4 is a schematic sectional view partly showing the magnetic storage device manufacturing method according to the first embodiment.

Referring then to FIG. 4, a lower electrode (plug) 14 using tungsten (W) is formed in the hole 12 in which the spacer insulating film 13 is formed. More specifically, first, a lower electrode film (tungsten film) is formed by CVD on the entire surface of the resultant structure including the hole 12. Then, the lower electrode film is removed from outside the hole 12 by chemical mechanical polishing (CMP) to obtain a structure as shown in FIG. 4. The side surface of the hole 12 is slanted or the hole 12 is tapered and accordingly the side surface of the lower electrode 14 is also slanted or the lower electrode 14 is tapered. Therefore, the angle of the corner (upper corner) defined by the top of the lower electrode 14 and the side surface thereof is smaller than 90 degrees.

Figure 5:
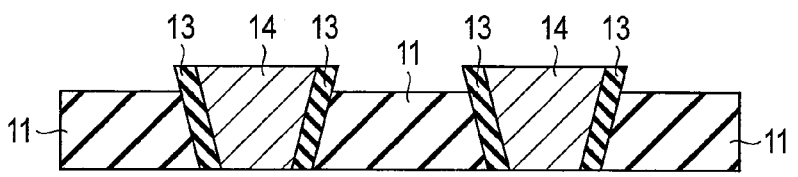
FIG. 5 is a schematic sectional view partly showing the magnetic storage device manufacturing method according to the first embodiment.

Referring then to FIG. 5, the insulating region 11 is etched to recess the top of the insulating region 11, thereby exposing an upper portion (second portion) of the lower electrode 14 and a portion of the spacer insulating film 13, which is formed on the side surface of the upper portion (second portion) of the lower electrode 14. More specifically, the insulating region 11 is etched back by wet etching. The amount of etching back of the insulating film 11 is about 3 nm to 10 nm, preferably about 5 nm. Instead of using the wet etching, RIE can be used to etch back the insulating film 11.

After performing the above steps, the structure shown in FIG. 5 can be obtained, which includes the insulating region 11, the lower electrode 14 including a first portion formed in the hole provided in the insulating region 11 and a second portion protruded from the insulating region 11, and the spacer insulating film 13 formed on the side surfaces of the first and second portions of the lower electrode 14.

Figure 6:
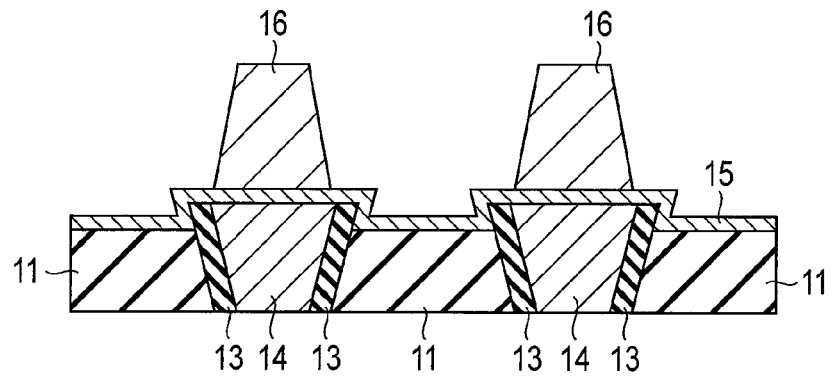
FIG. 6 is a schematic sectional view partly showing the magnetic storage device manufacturing method according to the first embodiment.

Referring then to FIG. 6, a magnetic tunneling junction film 15 is formed by sputtering using a sputtering equipment to cover the structure shown in FIG. 5. Before the magnetic tunneling junction film 15 is formed, a native oxide film formed on the lower electrode 14 is removed by sputter etching using an etching chamber in the same sputtering equipment. The magnetic tunneling junction film 15 is a stacked film of an under layer, a storage layer, a tunnel barrier layer, a reference layer and a shift canceling layer, as will be described later. Then, an upper electrode 16 is formed on the magnetic tunneling junction film 15 and above the lower electrode 14. As the upper electrode 16, a tungsten (W) film whose thickness is about 70 nm is used.

Figure 7:
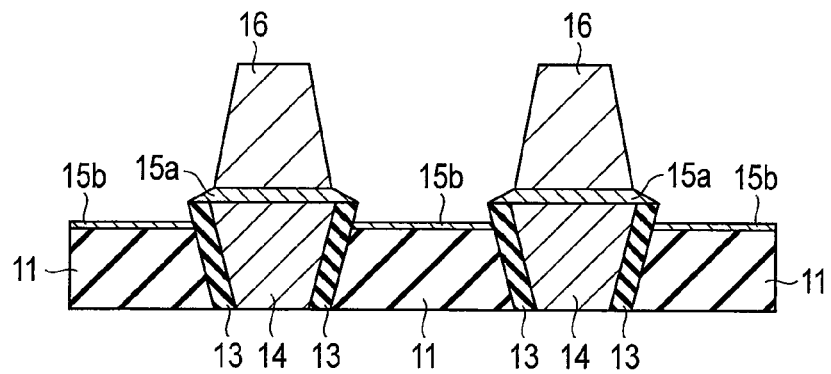
FIG. 7 is a schematic sectional view partly showing the magnetic storage device manufacturing method according to the first embodiment.

Referring then to FIG. 7, the magnetic tunneling junction film 15 is etched using the upper electrode 16 as a hard mask to remove a portion of the film 15 which is formed on the side surface of the spacer insulating film 13. Accordingly, a magnetic tunneling junction portion 15a is formed on the top of the lower electrode 14. The etching of the magnetic tunneling junction film 15 is performed by anisotropic etching. Ion beam etching (IBE) is used as the anisotropic etching. The magnetic tunneling junction film 15 is obliquely irradiated with ion beams.

Since, as described above, the angle of the upper corner of the lower electrode 14 is smaller than 90 degrees, the angle of the upper corner of the spacer insulating film 13 is also smaller than 90 degrees. Since, furthermore, the magnetic tunneling junction film 15 is formed by sputtering, the magnetic tunneling junction film 15 is easily thinned on the side surface of the spacer insulating film 13 that is protruded from the insulating region 11. If anisotropic etching is performed for the magnetic tunneling junction film 15 using ion beams, a portion of the film 15 which is formed on the side surface of the spacer insulating film 13 can effectively be removed. The side surface of the magnetic tunneling junction portion 15a, which results from the anisotropic etching, is slanted to the upper electrode 16.

When the anisotropic etching of the magnetic tunneling junction film 15 is completed, the film 15 can be removed completely from the insulating region 11 or part 15b of the film 15 can be left on the insulating region 11.

After performing the above steps, a magnetic storage device having the structure shown in FIG. 7 can be obtained. The magnetic storage device comprises the insulating region 11, the lower electrode 14 including a first portion formed in the hole provided in the insulating region 11 and a second portion protruded from the insulating region 11, the spacer insulating film 13 formed on the side surfaces of the first and second portions of the lower electrode 14, the magnetic tunneling junction portion 15a formed on the top of the lower electrode 14, and the upper electrode 16 formed on the magnetic tunneling junction portion 15a.

Figure 8:
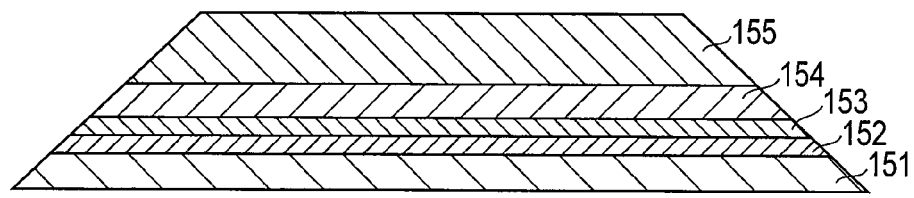
FIG. 8 is a schematic sectional view showing a structure of a magnetic tunneling junction portion.

FIG. 8 is a schematic sectional view showing a structure of the magnetic tunneling junction portion 15a obtained through the above steps.

The magnetic tunneling junction portion 15a has a stacked structure of an under layer 151, a storage layer 152, a tunnel barrier layer 153, a reference layer 154 and a shift canceling layer 155.

The under layer 151 is formed of, for example, Ta or W and its thickness is about 5 nm to 10 nm. The storage layer 152 is formed of, for example, CoFeB and its thickness is about 1 nm. The tunnel barrier layer 153 is formed of, for example, MgO and its thickness is about 1 nm. The reference layer 154 is a multilayer film formed of, for example, CoFeB and CoPd and its thickness is about 6 nm. The shift canceling layer 155 is a multilayer film formed of, for example, Ru and CoPt and its thickness is about 20 nm.

Figure 9:
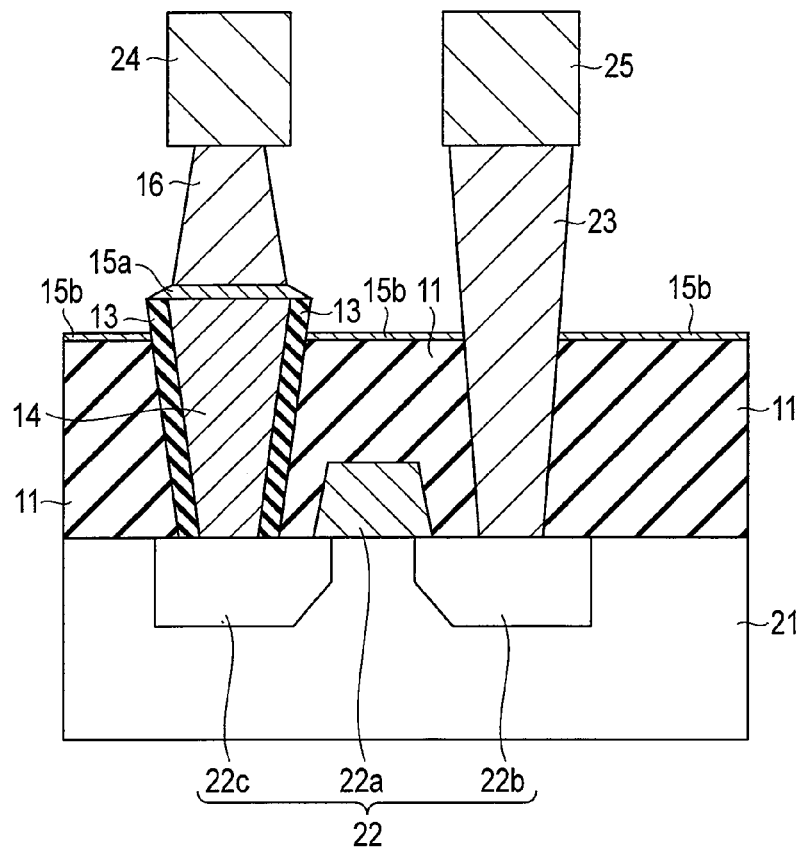
FIG. 9 is a schematic sectional view showing a structure of a magnetic storage device including a magnetic tunneling junction.

FIG. 9 is a schematic sectional view showing a structure of a magnetic storage device including the magnetic tunneling junction obtained through the above steps.

As shown in FIG. 9, a MOS transistor 22 including a gate 22a, a source 22b and a drain 22c is provided in a surface area of a semiconductor substrate 21. A lower electrode (contact plug) 14 is connected to the drain 22c of the MOS transistor 22. A source line contact 23 is connected to the source 22b of the MOS transistor 22. An electrode 24 is connected to an upper electrode (via plug) 16, and an electrode 25 is connected to the source line contact 23.

As described above, according to the first embodiment, the upper portion (second portion) of the lower electrode 14 protrudes from the insulating region 11. The spacer insulating film 13 is formed on the side surface of the upper portion (second portion) of the lower electrode 14 (in the first embodiment, the spacer insulating film 13 is also formed on the side surface of the lower portion (first portion) of the lower electrode 14) and, in other words, the spacer insulating film 13 is formed on a step between the lower electrode 14 and the insulating region 11. Thus, the magnetic tunneling junction portion 15a can reliably be separated by this step. Accordingly, when the magnetic tunneling junction film 15 is etched to form a magnetic tunneling junction portion 15a, the etching need not be performed too excess. Thus, a short-circuit is hard to occur due to a tunnel redeposition layer formed on the side surface of a magnetic tunneling junction at the time of etching between magnetic layers between which a tunnel barrier layer is interposed. According to the first embodiment, therefore, the magnetic tunnel junction can greatly be improved in characteristic and reliability.

Since, furthermore, the angle of the corner (upper corner) defined by the top of the lower electrode 14 and the side surface thereof is smaller than 90 degrees, a portion of the magnetic tunneling junction film 15 which is formed on the side surface of the spacer insulating film 13 can effectively be removed, with the result that the above-described advantages can reliably be produced. Even if the angle of the upper corner is 90 degrees or more, the advantages can be fully produced.

Since, moreover, the magnetic tunneling junction portion 15a can reliably be separated by the step described above, it does not matter that part of the magnetic tunneling junction film 15 remains on the insulating region 11 when the film 15 is etched to form the portion 15a. In other words, part of the magnetic tunneling junction film 15 may remain on the insulating region 11 and thus the film 15 need not be etched too excess. Since part of the film 15 may remain on the insulating region 11, the under layer 151 of the film 15 can be increased in thickness.

Second Embodiment

FIGS. 10-15 are schematic sectional views each partly showing a magnetic storage device manufacturing method according to a second embodiment. The same matter as described with respect to the first embodiment is omitted because the structure and manufacturing method of the magnetic storage device according to the second embodiment is basically similar to those of the magnetic storage device according to the first embodiment.

Figure 10:
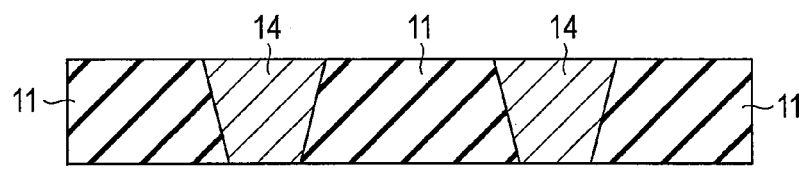
FIG. 10 is a schematic sectional view partly showing a magnetic storage device manufacturing method according to a second embodiment.

Referring first to FIG. 10, a tapered hole is formed in an insulating region (e.g., an interlayer insulating film) 11 by RIE. Then, a lower electrode (plug) 14 using tungsten (W) is formed in the hole. As in the first embodiment, the side surface of the lower electrode 14 is slanted, or the lower electrode 14 is tapered. Thus, the angle of the corner (upper corner) defined by the top of the lower electrode 14 and the side surface thereof is smaller than 90 degrees.

Figure 11:
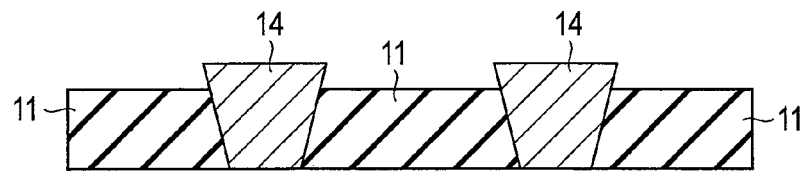
FIG. 11 is a schematic sectional view partly showing the magnetic storage device manufacturing method according to the second embodiment.

Referring then to FIG. 11, the insulating region 11 is etched to recess the top of the insulating region 11, thereby exposing an upper portion (second portion) of the lower electrode 14. More specifically, the insulating region 11 is etched back by wet etching. The amount of etching back of the insulating film 11 is about 3 nm to 10 nm. Instead of using the wet etching, RIE can be used to etch back the insulating film 11.

Figure 12:
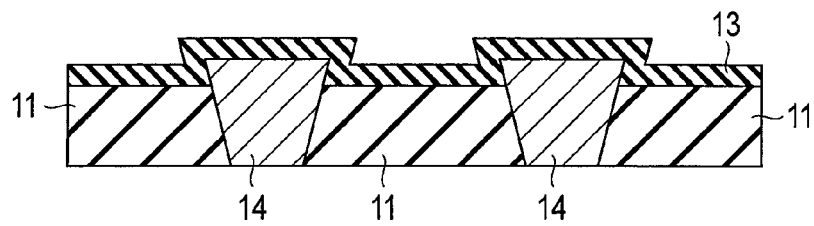
FIG. 12 is a schematic sectional view partly showing the magnetic storage device manufacturing method according to the second embodiment.

Referring then to FIG. 12, a silicon nitride film is formed as a spacer insulating film 13 to have a thickness of about 5 nm on the entire surface of the resultant structure by CVD. More specifically, the spacer insulating film 13 is formed on the top of the lower electrode 14, the side surface of the upper portion (second portion) of the lower electrode 14, and the top of the insulating region 11 which is recessed by the etching. As the spacer insulating film 13, an atomic layer deposition (ALD) alumina film (AlOx) can be used.

Figure 13:
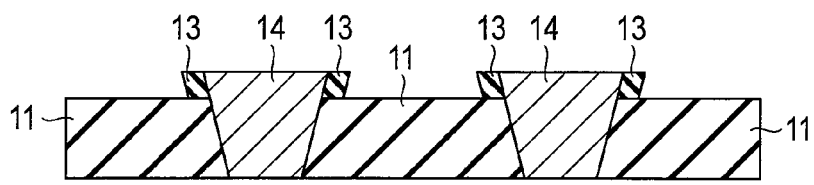
FIG. 13 is a schematic sectional view partly showing the magnetic storage device manufacturing method according to the second embodiment.

Referring then to FIG. 13, the spacer insulating film 13 is etched by RIE, or it is etched back. As a result, the spacer insulating film 13 is removed from the top of the lower electrode 14 and the top of the insulating region 11 that is recessed, and remains on the side surface of the upper portion (second portion) of the lower electrode 14.

Figure 14:
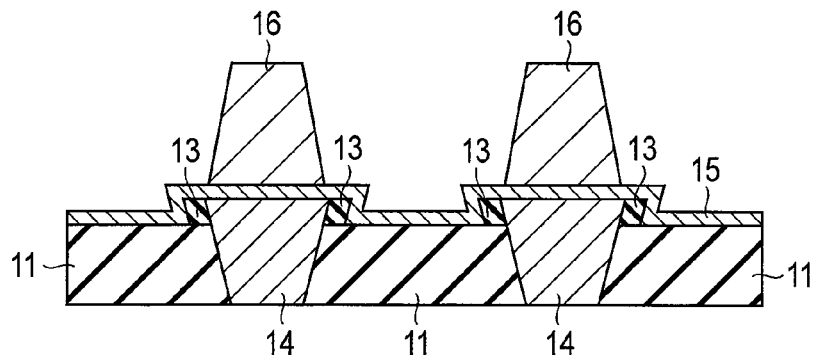
FIG. 14 is a schematic sectional view partly showing the magnetic storage device manufacturing method according to the second embodiment.
Figure 15:
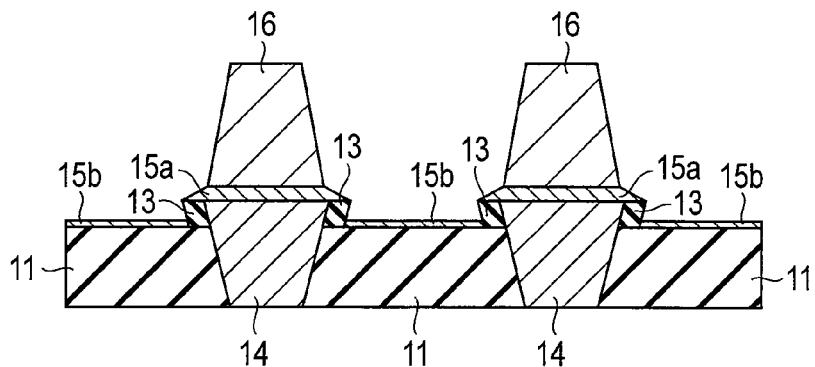
FIG. 15 is a schematic sectional view partly showing the magnetic storage device manufacturing method according to the second embodiment.

The steps shown in FIGS. 14 and 15 are similar to those shown in FIGS. 6 and 7 of the first embodiment. In the step shown in FIG. 14, a magnetic tunneling junction film 15 is formed by sputtering and then an upper electrode 16 is formed on the magnetic tunneling junction film 15 and above the lower electrode 14. In the step shown in FIG. 15, the magnetic tunneling junction film 15 is etched by anisotropic etching using the upper electrode 16 as a hard mask to remove a portion of the film 15 which is formed on the side surface of the spacer insulating film 13. Accordingly, a magnetic tunneling junction portion 15a is formed on the top of the lower electrode 14. When the anisotropic etching of the magnetic tunneling junction film 15 is completed, the film 15 can be removed completely from the insulating region 11 or part 15b of the film 15 can be left on the insulating region 11.

After performing the above steps, a magnetic storage device having the structure shown in FIG. 15 can be obtained. The magnetic storage device comprises the insulating region 11, the lower electrode 14 including a first portion formed in the hole provided in the insulating region 11 and a second portion protruded from the insulating region 11, the spacer insulating film 13 formed on the side surface of the second portion of the lower electrode 14, the magnetic tunneling junction portion 15a formed on the top of the lower electrode 14, and the upper electrode 16 formed on the magnetic tunneling junction portion 15a. Unlike in the first embodiment, in the second embodiment, the spacer insulating film 13 is not formed on the side surface of the first portion of the lower electrode 14.

The structure of the magnetic tunneling junction portion 15a is similar to that shown in FIG. 8 of the first embodiment.

Furthermore, the basic structure of the magnetic storage device including a magnetic tunneling junction obtained through the above steps is similar to that shown in FIG. 9 of the first embodiment.

As described above, the basic structure and basic manufacturing method of the second embodiment is similar to those of the first embodiment. Accordingly, the same advantages as those of the first embodiment can be produced from the second embodiment.

Though the size of the pattern of the upper electrode 16 is not specifically discussed in the above first and second embodiments, it is desirable to set the size as follows.

The upper electrode 16 serves as a hard mask to etch the magnetic tunneling junction film 15. When the etching of the film 15 is completed, the magnetic tunneling junction portion 15a needs to be separated with reliability. It is thus desirable that the pattern of the upper electrode 16 should be smaller than a pattern formed by the lower electrode 14 and spacer insulating film 13 when the upper electrode 16 is viewed from the direction parallel to the direction in which the lower electrode 14, magnetic tunneling junction portion 15a and upper electrode 16 are stacked (viewed from the direction perpendicular to the interface between the lower electrode 14 and the magnetic tunneling junction portion 15a). In other words, it is desirable that the pattern of the upper electrode 16 should be formed inside the pattern formed by the lower electrode 14 and spacer insulating film 13. Viewed from the above stacking direction, it is more desirable that the pattern of the upper electrode 16 should be equal to or smaller than that of the lower electrode 14 and, in other words, it is more desirable that the pattern of the upper electrode 16 should be equal to that of the lower electrode 14 or it is formed inside the pattern of the lower electrode 14.

If the size of the pattern of the upper electrode 16 is set as described above, a portion of the magnetic tunneling junction film 15 which is formed on the side surface of the spacer insulating film 13 can effectively be removed by etching and the magnetic tunneling junction portion 15a can reliably be separated.

Each of above described MTJ structures can be introduced as MTJ elements of memory cells. Memory cells, Memory cell arrays, and memory devices is described in U.S. patent application Ser. No. 13/420,106, Also, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic storage device comprising:
an insulating region;
a lower electrode including a first portion formed in a hole provided in the insulating region and a second portion protruded from the insulating region, the first portion having a first side surface, the second portion having a second side surface, and the first and second side surfaces being continuous;
a spacer insulating film formed at least on the second side surface;

a magnetic tunneling junction portion formed on a top surface of the lower electrode and physically contacting the lower electrode; and an upper electrode formed on the magnetic tunneling junction portion.

2. The device of claim 1, wherein the spacer insulating film is also formed on the first side surface.

3. The device of claim 1, wherein the spacer insulating film is formed only on the second side surface.

4. The device of claim 1, wherein the spacer insulating film includes a silicon nitride film or an alumina film.

5. The device of claim 1, wherein an angle of a corner defined by the top surface of the lower electrode and a side surface of the lower electrode is smaller than 90 degrees.

6. The device of claim 1, wherein the magnetic tunneling junction portion has a side surface which is slanted.

7. The device of claim 1, wherein part of a magnetic tunneling junction film for forming the magnetic tunneling junction portion remains on the insulating region.

8. The device of claim 1, wherein a pattern of the upper electrode is smaller than a pattern formed by the lower electrode and the spacer insulating film when the pattern of the upper electrode is viewed from a direction parallel to a direction in which the lower electrode, the magnetic tunneling junction portion, and the upper electrode are stacked.

* * * * *